Figure 1:
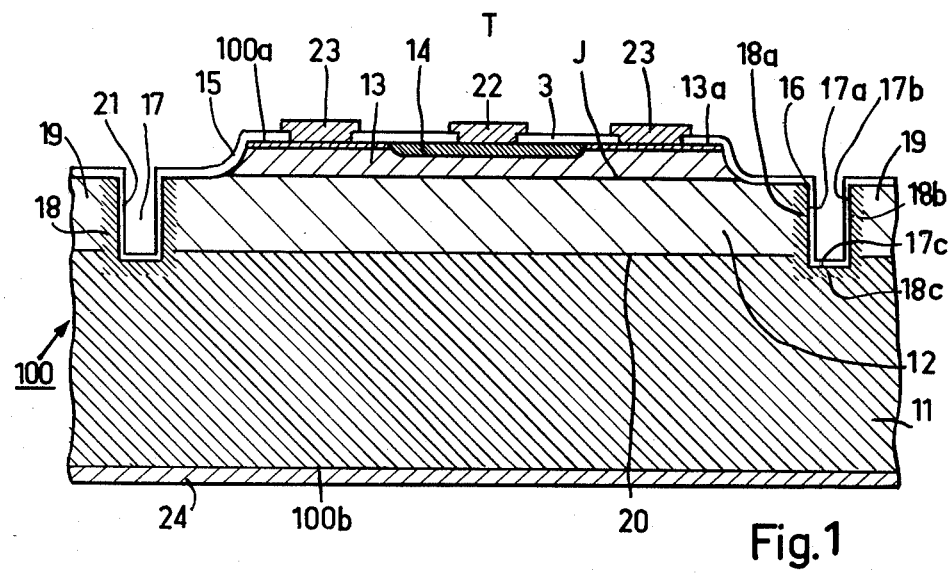

United States Patent [19]

Roger

[11] 4,249,195
[45] Feb. 3, 1981

[54] MESA-TYPE TRANSISTOR AND METHOD OF PRODUCING SAME

[75] Inventor: Bernard Roger, Carpiquet, France

[73] Assignee: U.S. Philips Corporation, New York, N.Y.

[21] Appl. No.: 961,333

[22] Filed: Nov. 16, 1978

[30] Foreign Application Priority Data

Nov. 29, 1977 [FR] France ............................. 77 35851

[51] Int. Cl.³ .......................................... H01L 29/06
[52] U.S. Cl. ......................................... 357/55; 357/56
[58] Field of Search ................................... 357/55, 56

[56] References Cited

U.S. PATENT DOCUMENTS

| 4,156,250 | 5/1979 | Trap ........................................ 357/73 |
| 4,165,516 | 8/1979 | Smulders ................................. 357/34 |

OTHER PUBLICATIONS

Maheux, *I.B.M. Tech. Disc., Bull.* vol. 11, No. 12, May 1969, p. 1690.

*Primary Examiner*—Martin H. Edlow
*Attorney, Agent, or Firm*—Thomas A. Briody; Robert T. Mayer; Paul R. Miller

[57] ABSTRACT

The invention relates to a mesa transistor comprising a highly doped substrate, on which there is provided a lower doped collector region of the same conductivity type, a base zone of the opposite conductivity type provided on said collector region and an emitter zone provided in the base region with the mesa being formed by a recess in a flat upper face of the semiconductor plate which recess fully encloses the base zone and extends into the substrate. According to the invention the recess consists of a first portion extending over a part of the thickness of said collector region only, and a groove extending from the bottom of this first portion into the substrate. The wall and the bottom of this last-mentioned groove preferably everywhere adjoin a thin, highly doped semiconductor zone of the same conductivity type as the substrate.

17 Claims, 9 Drawing Figures

MESA-TYPE TRANSISTOR AND METHOD OF PRODUCING SAME

The invention relates to a semiconductor device comprising at least a bipolar transistor and having a semiconductor body comprising at least a layer-shaped first region of the first conductivity type, a layer-shaped second region also of the first conductivity type but lower doping concentration than that of the first region being situated on said first region with the first and second regions forming the collector zone of the transistor, a layer-shaped third region adjoining the upper face and being of the second, opposite conductivity type which forms at least a portion of the base zone, being situated on the second region and an emitter zone of the first conductivity type which adjoins the base zone and the upper face, and a recess which extends into the first region through the second and the third region being provided in the upper face. The features of the present invention reside in that the recess is formed with a first portion being a mesa-like form from the surface of the third region to the second region and with a second portion being a groove in the second region extending to the first region.

The invention also relates to a method of manufacturing such a semiconductor device.

The invention relates more particularly to the manufacturing of high-voltage power transistors.

A semiconductor device having a transistor of the described type is disclosed in French Patent Application No. 2,309,980.

In this known device the mesa-transistor is laterally bounded by a recess formed by a groove provided in the upper face of the device and extending into the first region (formed by a highly doped substrate).

However, difficulties are occasionally encountered in the production of this known transistor, for example where high-voltage transistors are concerned with the weakly doped collector layer (the second region) which covers the substrate being very thick, for example 60 $\mu m$ to 100 $\mu m$). Taking the thickness (approximately 25 $\mu m$) of the layer which forms the base region of the transistor into account it is therefore necessary to provide a groove which is at least 90 $\mu m$ to 130 $\mu m$ thick, in order to have the groove penetrate into the subjacent substrate. Furthermore, the realization of such a deep groove by means of chemical etching gives rise to certain problems:

in the first place for the etching operation itself, the deeper the groove, the longer the etching period and the more difficult the etching operation, and in the second place such a groove has of necessity, a wide upper face, so that the groove covers a relatively large surface area (25% to 30% of the entire surface area) compared to the surface area occupied by the transistor itself.

In addition, it is relatively difficult to work with a structure having a groove which has a very large width at the surface. If, for example, contact zones must be formed on the upper face of the transistor, the remaining portion of the surface area must be protected by means of a photo-sensitive lacquer. However, it has proved very difficult to have the photo-sensitive lacquer adhere to the outer edges of the groove; when the groove is wide the photo-sensitive lacquer will tend to leave the edges owing to the centrifugal effect, so that these edges are not provided with lacquer.

The object of the invention is inter alia the production of a mesa-transistor in the form of a discrete element which is laterally bounded by a recess having a relatively small width relative to grooves formed in known transistors with the transistor according to the present invention, however, retaining all the electrical advantages of these known transistors.

According to the present invention a semiconductor device of the type described in the preamble is characterized in that the recess consists of a first portion extending from the upper face through the third region and through a portion of the second region to form a mesa comprising the entire base zone, and a groove which extends from the bottom of the first portion of the recess into the first region.

Compared with transistors according to the prior art, which are laterally bounded by a deep groove, the device according to the present invention has inter alia the advantage that it is much easier to produce. In the transistor according to the invention the recess is made in two stages. In the first stage an etched recess is made from the upper face of the crystal to a few micron above the base-collector junction, resulting in a vertical distance which is substantially limited to the thickness of the base region. In the second stage a similar shallow groove is made, for example, by mechanical means. For the above example of a high-voltage mesa transistor the depth of the recess obtained by means of etching does not exceed 30 micron. It is obvious that it is easier to etch a recess having a depth of 30 micron than to make a recess which is more than 100 micron deep, as required for the described known transistor.

It is obvious that a recess having a depth of 30 micron permits a width at the surface of the structure which is less than the width required for a recess having a depth of 100 micron. This requires less space at the surface of the structure.

Furthermore, the present invention has proved that it is possible to coat the edges of a recess which is approximately 30 micron deep with a photo-sensitive lacquer which, as mentioned above, is very difficult for a recess of a considerably larger width and depth.

When the grooves, made in the second stage, which extend into the first region are produced mechanically, for example by sawing, the crystal structure of these grooves will be seriously disturbed at the bottom and at the walls. Therefore, the wall and the bottom of this groove preferably adjoin everywhere a layer-shaped thin semiconductor zone of the first conductivity type which has a higher doping concentration than the second region. As a result thereof the depletion zone of the collector-base junction cannot penetrate to the disturbed surface. When the depletion zone extends either into the depth of the crystal or in the lateral direction thereof, the depletion zone will invariably meet a semiconductor region which serves as a barrier: in the case of an extension into the depth the semiconductor region is the first region, whereas in the case of a lateral extension the semiconductor region is formed by the semiconductor zone surrounding the shallow groove with both the first region and the semiconductor zone being relatively highly doped compared with the second region. When the shallow groove penetrates into the first region there is an electric continuity between the zone and the first region; and in that manner it is impossible for the depletion zone to surround the shallow groove.

A preferred embodiment is characterized in that the distance from the intersecting line of the p-n junction between the second and the third region with the surface to the edge of the groove, measured along the side wall of the mesa, is at least equal to the distance from this p-n junction to the plane of separation between the first and the second region.

In accordance with a preferred embodiment of a high-voltage mesa-transistor according to the present invention the semiconductor zone of the first conductivity type is obtained simultaneously with the emitter zone by diffusion. Consequently, the formation of this semiconductor zone does not require an additional process step. Advantageously, the semiconductor zone will be 4.5 $\mu$m to 5.5 $\mu$m thick, where the thickness must in any case exceed 1 $\mu$m.

To achieve that the semiconductor zone forms an efficient barrier against lateral extension of the depletion zone, the ratio between the doping concentration of said semiconductor zone and the doping concentration of the second region or collector region, wherein the groove is present, must preferably be equal to $10^3$; the most advantageous ratio ranges from $10^3$ to $10^7$. On the other hand the average doping concentration of the semiconductor zone preferably is approximately equal to the average doping concentration of the first region.

Furthermore, the invention relates to a particularly suitable method of producing the described semiconductor device. This method is characterized in that there is provided a semiconductor body comprising at least a layer-shaped first region of a first conductivity type adjoining the lower face, located thereon a second region of the first conductivity type having a doping concentration which is smaller than that of the first region, and located thereon a layer-shaped third region of the second, opposite conductivity type adjoining the upper face. Further, the method provides at least two series of mutually parallel wide grooves etched in the upper face with these recesses extending into but not through the entire thickness of the second region, and being etched in the upper face, the series being at an angle with each other, whereby the grooves extend into but not through the entire thickness of the second region thus providing mutually coherent mesas. Thereafter into the bottom of each wide groove there are formed by mechanical means two mutually parallel narrow grooves which extend into the first region, a doping material of the first conductivity type is diffused into the bottom and the walls of the narrow grooves for forming the semiconductor zones with the emitter zones and the metallization being provided, and the semiconductor devices are separated from one another along lines between the two narrow grooves.

Figure 3A:
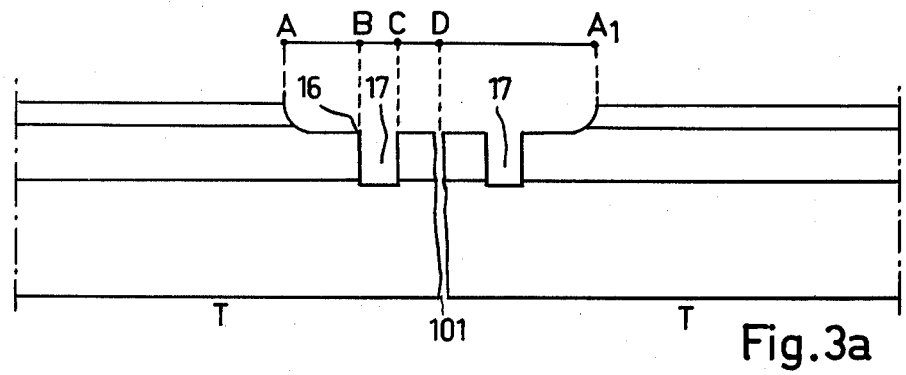
Figure 3B:
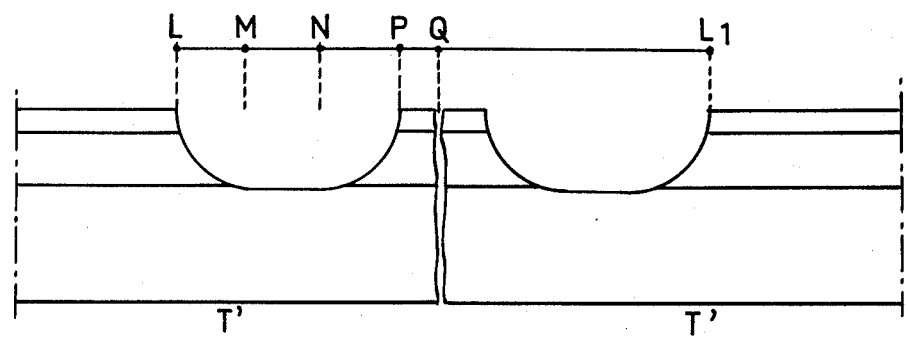

The invention will now be further explained with reference to the drawing wherein:

FIG. 1 shows a cross-sectional view of a mesa-transistor according to the present invention, FIGS. 2a to 2f inclusive show the successive stages of the manufacturing of the transistor of FIG. 1, and FIGS. 3a and 3b show in the same scale cross-sectional views of the edge portions of two electrically equivalent transistors with the transistor shown in FIG. 3a being a transistor according to the present invention and the transistor shown in FIG. 3b being a prior art transistor.

In regard to these Figures it must be noted that for clarity the Figures are shown schematically and not to scale.

The transistor shown in FIG. 1 is produced together with many other identical transistors on one semiconductor plate.

As shown in FIG. 1 the semiconductor device comprises a bipolar transistor having a semiconductor body including at the lower face 100b, a layer-shaped first region 11 of a first conductivity type on which a layer-shaped second region 12 of the same type but having a lower doping concentration is located. In this example the semiconductor body is made of silicon but other materials can also be used such as germanium or gallium arsenide. The regions 11 and 12 constitute the collector zone. A layer-shaped third region 13, adjoining the upper face 100a and being of the second, opposite conductivity type and constituting the base zone, is located on region 12. The emitter zone 14 of the first conductivity type adjoins the base zone. A recess extending through the second region 12 and the third region 13 into the first region 11 is provided in the upper face 100a.

According to the present invention this recess consists of a first portion extending from the upper face 100a through the third region 13 and through a portion of the second region 12 to constitute a mesa 15 which completely comprises the base zone, and a groove 17 extending from the bottom 16 of the first portion of the recess into the first region 11. In addition, the wall 17a and the bottom 17c of the groove 17 are, in this example, everywhere contiguous to a thin semiconductor zone 18 being of the first conductivity type and having a higher doping concentration than the second region 12.

From the electrical point of view only the portion 18a of zone 18 influences the operation of the transistor. The portion 18a prevents the depletion zone which extends on either side of the p-n junction J and, particularly, in the collector region 12 of the transistor from extending laterally up to the wall 17a of the shallow groove 17. Namely, the crystal lattice is seriously disturbed along the groove 17 over a depth of 1 micron to 3 micron from the surface as a result of the mechanical operation by means of which the shallow groove 17 is formed. Should the relatively poorly doped zone 18a be absent, unwanted recombination, which might particularly give rise to a very pronounced decrease of the breakdown voltage of the p-n junction J might occur.

Because of the fact that the groove 17 penetrates into the region 12 this groove limits in the lateral direction the region 12 of the collector zone of the transistor T. In the region 12 the groove simultaneously defines a peripheral portion in the form of a small wall 19 which forms the lateral limit of the wafer 100.

By way of indication some data are now given which may be applicable for the construction of a high-voltage mesa transistor which must be able to withstand a collector-base voltage of at least 800 volts.

The region 11, which is approximately 300 micron thick and which is N+ conductive is doped by means of antimony to approximately $3 \times 10^{18}$ atoms/cm$^3$, generally from $5 \times 10^{17}$ to $1 \times 10^{21}$ atoms/cm$^3$.

The collector region 12, which is approximately 60 micron thick and which is N conductive is doped by means of arsenic to approximately $1.2 \times 10^{14}$ atoms/cm$^3$, generally from $9 \times 10^{13}$ to $1.5 \times 10^{14}$ atoms/cm$^3$, so that the collector region 12 obtains a resistivity of about 40 $\Omega$ cm.

The base region 13, which is approximately 25 micron thick is P conductive and is doped by means of boron to $5 \times 10^{14}$ atoms/cm$^3$; and the resistivity of the region 13 is 25 Ω cm. The surface contact layer 13a of region 13 is P conductive; the resistivity (approximately 30 m Ω cm) is low compared to that of the region 13; and the contact layer 13a is 3 micron thick, in general between 1 micron and 6 micron.

The emitter region 14, which is approximately 5 micron thick, is N+ conductive; its surface is doped to $5 \times 10^{20}$ atoms/cm$^3$, generally between $5 \times 10^{17}$ and $1 \times 10^{21}$ atoms/cm$^3$; and the resistivity of the region 14 is approximately 1 m Ω cm. The same thickness, the same doping concentration and the same specific resistance hold for the zone 18, which is advantageously formed simultaneously with the emitter region 14.

The groove 17 has an average width of, for example, 40 micron (30 micron to 60 micron), and penetrates into the first region over a distance of at least 10 micron. The wall 19 is 45 micron to 50 micron thick.

As stated above, it is advantageous when measured along the side wall 15 of the mesa that the distance from the intersecting line of the p-n junction J between the second region 12 and the third region 13 to the edge of the groove 17 is at least equal to the distance from the p-n junction J to the interface 20 between the first region 11 and the second region 12.

The FIGS. 2a to 2f inclusive will now be described to illustrate successive stages of the manufacturing of a transistor as shown in FIG. 1.

Figure 2A:
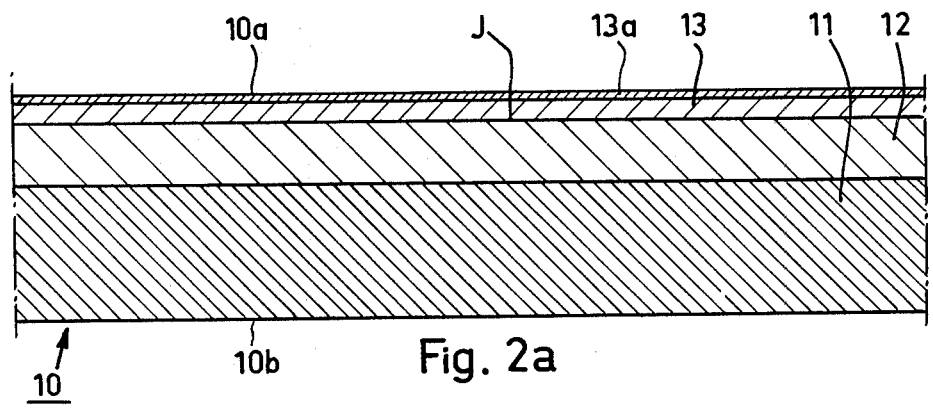
Figure 2B:
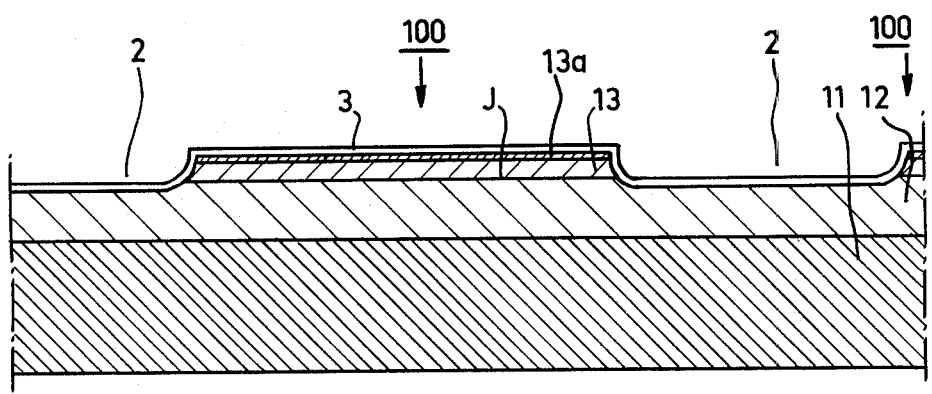
Figure 2C:
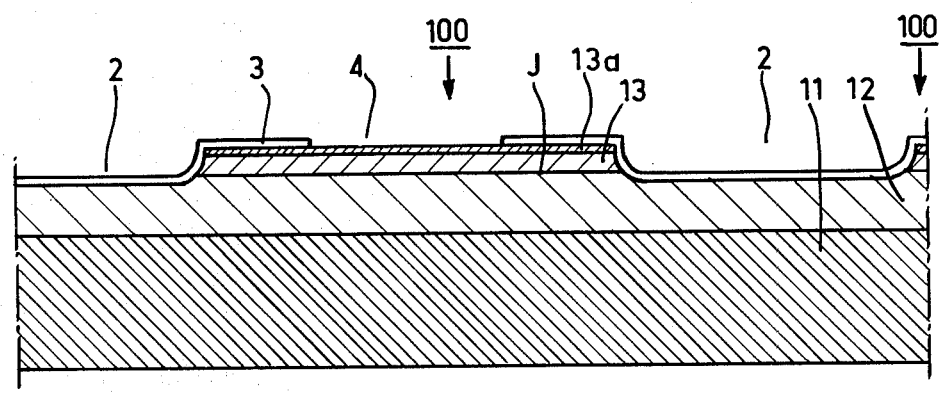
Figure 2D:
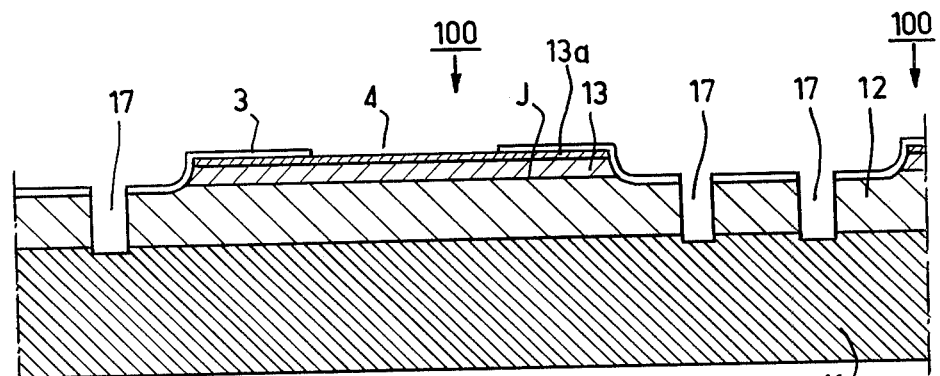

FIG. 2a shows a portion of a silicon wafer 10 having a N+ conductive first region 11, a N conductive second region 12 and a P conductive third region 13. Preferably, the regions 12 and 13 are obtained by means of a continuous epitaxial growth process. A p-n junction J constitutes the interface between the regions 12 and 13.

First a doping material of the P conductivity type is diffused across the entire surface area 10a of the wafer 10 to form the surface layer 13a which is doped to a higher extent than the subjacent region 13. Thereafter the wafer is subjected to a photo-etching operation to form recesses 2 in the form of wide grooves or moats having a bottom extending into the region 12 to a level which is 4 to 5 microns below the level of the p-n junction J. These recesses are divided into two groups with the first group being at an angle to the second group, and in this example it is perpendicular to the second group, and define in the wafer 10 several wafer sections each corresponding to a further transistor T. After the recesses 2 have been made, the wafer 10 is subjected to an oxidizing process to form the layer 3, which will be the passivating layer (see FIG. 2b).

Thereafter the required windows 4 are provided for the emitter zone (see FIG. 2c) by means of photoetching. In the wafer 10 thus prepared, shallow grooves 17 are made by mechanical means (two parallel grooves 17 in each recess 2) which extend into the region 11, so that the wafer sections 100 are now more or less separated from one another but remain mechanically connected for additional processing (see FIG. 2d).

Figure 2E:
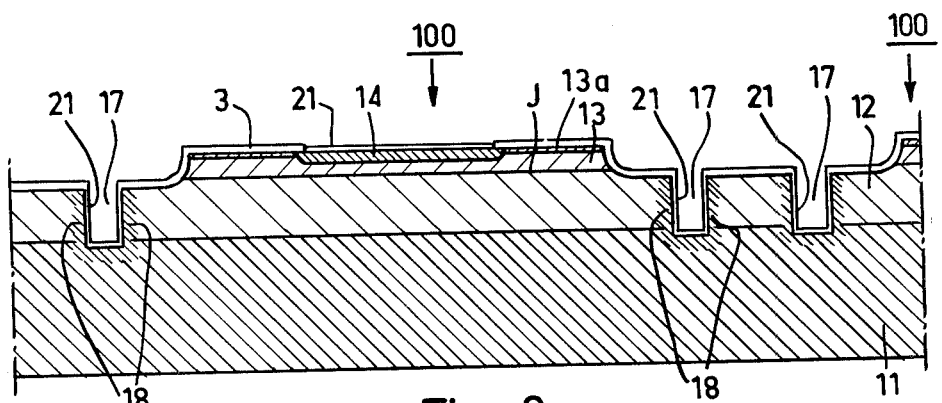

After having been cleaned the wafer 10 is subjected to a diffusion process for forming the N+ emitter regions 14 and the zones 18 along the wall and the bottom of the grooves 17 (see FIG. 2e). During this diffusion process a thin oxide layer 21 is formed at the surface of the emitter zone and inside the grooves.

Figure 2F:
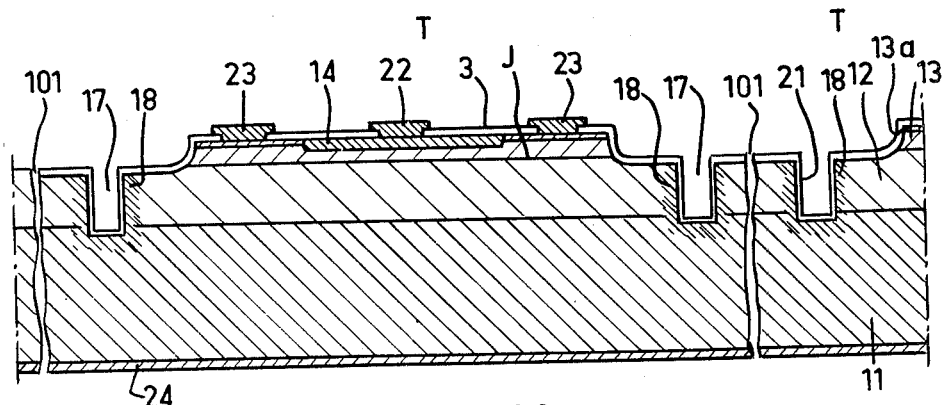

After metallisation, for the application of the contacts 22, 23 and 24, the wafers 10 are completely separated, for example by means of a laser which produces the lines of separation 101 (see FIG. 2f).

Regarding the manufacturing method described above it should be noted that the formation of the highly doped zones 18 along the wall and the bottom of the shallow grooves 17 does not require an additional process stage since the zones are obtained simultaneously with the emitter zones 14.

The preceding example describes the realization of npn transistors but is possible to realize pnp transistors in the same manner.

FIGS. 3a and 3b show that a mesa transistor T produced in accordance with the present invention (FIG. 3a) requires less room than an electrically identical transistor T bounded by a single deep groove (FIG. 3b).

By way of example the comparison relates to two transistors whose collector regions are 60 micron thick whereas the base regions are 25 micron thick.

In FIG. 3a the horizontal distance AD between the upper edge of the mesa structure and the intersecting line 101 between two adjacent transistors T is approximately 170 microns. This distance is the sum of: distance AB=80 micron from the upper edge to the inner edge 16 of the shallow groove 17, distance BC=40 micron corresponding to the width of the shallow groove 17, and finally, distance CD=50 micron from the outer edge of the groove 17 and the intersecting line 101.

In FIG. 3b the corresponding horizontal distance LQ between the upper edge of the mesa-structure and the intersecting line between two transistors T' is considerably larger, namely in the order of 300 micron, 250 micron of which (distance LP) are required for the width of the single deep recess and 50 micron (distance PQ) for the distance between the outer edge of the recess and the intersecting line. Namely, for the recess itself it is necessary to use an etching window having a width of at least 70 micron (MN), to which must be added the distances LM=90 μm and NP=90 μm owing to the ensuing underetching.

It is obvious that it is easier to produce a recess having a width of 340 micron (distance between the upper edges A and A$_1$ of two adjacent MESA structures) and a depth of 30 micron, then to produce a recess having a width of 600 microns and a depth of 90 micron, as required for the prior art construction as shown in FIG. 3b.

In addition, the embodiment of FIG. 3a is of a more compact structure, which requires less room than the embodiment of FIG. 3b. The distance between the upper edges of the mesa-structures of two adjacent transistors T is 340 micron (distance AA$_1$) for FIG. 3a, whereas this distance is 600 micron (distance LL$_1$) for FIG. 3b.

It will be clear that the invention is not limited to the described embodiments but that many variations are possible within the scope of the invention. Particularly, the transistor according to the invention cannot only be used as a discrete element but also in integrated form. Furthermore, if the groove 17 is not produced mechanically but by means of an operation which does not cause large lattice disturbances the zone 18 can be omitted in certain circumstances.

What is claimed is:

1. A semiconductor device being at least a bipolar transistor comprising a first semiconductor layer of a first conductivity type; a second semiconductor layer adjoining said first layer and being of a lower doping concentration of said first conductivity type, said first and second layers forming a collector zone; a third semiconductor layer situated on said second layer and being of a second conductivity type, said third layer forming at least a portion of a base zone; an emitter zone of said first conductivity type formed in a surface of said third layer away from said second layer; and a recess including a first portion extending from said surface of said third layer through said third layer and at least along a major surface of said second layer for a predetermine distance to form a mesa-like base zone, and a second portion being a groove extending from said first portion at said second layer through said second layer into said first layer.

2. A semiconductor device according to claim 1, wherein said pre-determine distance separates said groove from an intersection between said second and third layers by a distance which is at least equal to a thickness of said second layer.

3. A semiconductor device according to claim 2, wherein said groove extends into said first layer by a depth of at least 10 $\mu$m.

4. A semiconductor device according to claim 2, wherein a thin semiconductor zone of said first conductivity type adjoins said groove at all areas thereof, said semiconductor zone having a higher doping concentration then said second layer.

5. A semiconductor device according to claim 4, wherein said semiconductor zone is at least 1 $\mu$m thick.

6. A semiconductor device according to claim 5, wherein said semiconductor zone has a thickness between 4.5 $\mu$m and 5.5 $\mu$m.

7. A semiconductor device according to claim 4, wherein said semiconductor zone has a thickness substantially equal to that of said emitter zone.

8. A semiconductor device according to claim 4, wherein said semiconductor zone has a doping concentration at least 1000 times higher than that of said second layer.

9. A semiconductor device according to claim 8, wherein said doping concentration of said semiconductor zone is at most $10^7$ times higher than that of said second layer.

10. A semiconductor device according to claim 4, wherein said semiconductor zone has an average doping concentration of at most a factor 10 of that of said first layer.

11. A semiconductor device according to claim 1, wherein a thin semiconductor zone of said first conductivity type adjoins said groove at all areas thereof, said semiconductor zone having a higher doping concentration than said second layer.

12. A semiconductor device according to claim 11, wherein said semiconductor zone is at least 1 $\mu$m thick.

13. A semiconductor device according to claim 12, wherein said semiconductor zone has a thickness between 4.5 $\mu$m and 5.5 $\mu$m.

14. A semiconductor device according to claim 11, wherein said semiconductor zone has a thickness substantially equal to that of said emitter zone.

15. A semiconductor device according to claim 11, wherein said semiconductor zone has a doping concentration at least 1000 times higher than that of said second layer.

16. A semiconductor device according to claim 15, wherein said doping concentration of said semiconductor zone is at most $10^7$ times higher than that of said second layer.

17. A semiconductor device according to claim 11, wherein said semiconductor zone has an average doping concentration of at most a factor 10 10 of that of said first layer.

* * * * *